(12) United States Patent
Costrini et al.

(10) Patent No.: US 6,333,559 B1
(45) Date of Patent: Dec. 25, 2001

(54) METHOD/STRUCTURE FOR CREATING ALUMINUM WIREBOUND PAD ON COPPER BEOL

(75) Inventors: Gregory Costrini, Hopewell Junction; Ronald Dean Goldblatt; John Edward Heidenreich, III, both of Yorktown Heights, all of NY (US); Thomas Leddy McDevitt, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/487,013

(22) Filed: Jan. 19, 2000

Related U.S. Application Data

(62) Division of application No. 09/167,834, filed on Oct. 7, 1998.

(51) Int. Cl.[7] .................................................. H01L 21/4763
(52) U.S. Cl. ........................ 257/762; 257/734; 257/750
(58) Field of Search ........................... 438/618; 257/762, 257/734, 750, 751

(56) References Cited

U.S. PATENT DOCUMENTS

| | | |
|---|---|---|
| 4,495,222 | 1/1985 | Anderson et al. . |
| 4,761,386 | 8/1988 | Buynoski . |
| 4,933,305 | 6/1990 | Kikkawa . |
| 5,130,779 * | 7/1992 | Agarwala et al. . |
| 5,284,797 | 2/1994 | Heim . |
| 5,350,488 | 9/1994 | Webb . |
| 5,384,284 | 1/1995 | Doan et al. . |
| 5,403,777 | 4/1995 | Bryant et al. . |
| 5,567,654 | 10/1996 | Beilstein, Jr. et al. . |
| 6,133,136 * | 10/2000 | Edelstein et al. . |

* cited by examiner

*Primary Examiner*—Kevin M. Picardat
*Assistant Examiner*—D. M. Collins
(74) *Attorney, Agent, or Firm*—Scully, Scott, Murphy & Presser; Eugene I. Shkurko

(57) ABSTRACT

The present invention provides a method for fabricating an integrated circuit (IC) structure having an Al contact in electrical communication with Cu wiring embedded in the initial semiconductor wafer. In accordance with the method of the present invention, the Al contact is formed in areas of the IC structure which contain or do not contain an underlying region of Cu wiring. The present invention also provides a method of interconnecting the fabricated structure to a semiconducting packaging material through the use of a wirebond or Controlled Collapse Chip Connection (C4) solder.

15 Claims, 5 Drawing Sheets

METHOD/STRUCTURE FOR CREATING ALUMINUM WIREBOUND PAD ON COPPER BEOL

RELATED APPLICATIONS

This application is a divisional of U.S. application Ser. No. 09/167,834 filed Oct. 7, 1998.

FIELD OF THE INVENTION

The present invention relates to packaging of integrated circuits and, in particular, to a method for creating an aluminum (Al) contact which is in electrical communication with the copper (Cu) interconnect wiring of an integrated circuit (IC) device. In one embodiment of the present invention, an aluminum "plug" structure that covers a large via and an underlying copper pad is employed. The second embodiment consists of an aluminum bond pad where the opening to the underlying copper is displaced laterally from the active region of the bond pad and the region defining the copper-aluminum connection is shrunken in size in order to minimize the copper-aluminum via area. The purpose of the aluminum contact that is described in this invention is to cover the exposed copper to prevent environmental attack and/or mixing of the materials used in forming the bond (i.e. lead-tin) with the underlying copper.

BACKGROUND OF THE INVENTION

In semiconductor manufacturing, a fabricated integrated circuit (IC) device is usually assembled into a package to be utilized on a printed circuit board as part of a larger circuit. In order for the leads of the package to make electrical contact with the bonding pads of the fabricated IC device, the metal bond is formed to make a connection between the bonding pad of the IC device and a lead extending Lo the package lead frame, or a solder ball connection to a ceramic or polymeric chip carrier.

In the past, Al and Al alloys have been used as conventional chip wiring materials. Al wiring material is being replaced by Cu and Cu alloys since Cu wiring provides improved chip performance and superior reliability when compared to Al and alloys of Al. The packaging of IC devices employing copper wiring presents a number of technical issues related to the reaction of copper with material used in the solder-ball process and/or susceptibility of copper to environmental attack and corrosion.

A typical prior art fabricated IC structure before interconnecting with a package is shown in FIG. 1. Specifically, the fabricated prior art IC structure shown in FIG. 1 comprises a semiconductor wafer 10 having at least one Cu wiring region 12 embedded in its surface. It is noted that semiconductor wafer 10 includes a plurality of IC device regions therein. For clarity, these IC device regions are not shown in the drawing. The prior art IC structure of FIG. 1 further includes a passivating layer 14 formed on the surface of semiconductor wafer 10 having an opening therein extending over regions of Cu wiring 12. in the opening, there is shown a terminal via barrier layer 16 which also extends over portions of the passivating layer near the opening. A second passivating layer 18 typically composed of an organic material such as a polyimide film having an opening over Cu wiring 12 is located on the surface of passivating layer 14.

The prior art structure shown in FIG. 1 is normally fabricated by providing a planarized IC wafer containing Cu wiring therein; forming a passivating layer on the surface of the planarized IC water; reactive ion etching (RIE) the passivating layer to form terminal via openings over the underlying Cu wiring; providing a barrier layer to said terminal via opening; forming an organic passivating layer on the surface of the barrier layer; and then etching the outer passivating layer to provide an opening to the Cu wiring.

In current practice, large (90 $\mu$m) terminal via openings are formed in passivating layer 14 to expose pads that are created at the underlying Cu wiring level. This process that is utilized in the prior art for Cu back-of-the-line (BEOL) structures was developed from previous BEOL technology wherein wirebond connections are made directly through the terminal via openings to the underlying Cu wiring. For current applications where additional Cu wiring levels are being employed, there are several problems with using the above technology.

First, since copper does not form a self-passivating oxide layer as does aluminum, copper exposed to atmospheric conditions will corrode to a depth of several thousand angstroms degrading the reliability of the IC device. Second, for the solder-ball application, the commonly used ball-limiting or barrier metallurgies may not be compatible with copper metallization and might allow the mixing of the lead-tin (Pb—Sn) solder material with the underlying copper. In this event, brittle Cu—Sn intermetallics will form increasing the electrical resistivity and compromising the reliability of the interconnection scheme.

In view of the drawbacks mentioned with the prior art process of a packaging connection on copper wiring LC structures, there is a continued need to develop new and improved processes that overcome the disadvantages associated with prior art processes. The requirements of this structure and method are that it be compatible with conventional chip packaging and test methodologies and that it protect the copper wiring from environmental attack and/or reactions with the packaging materials.

SUMMARY OF THE INVENTION

One object of the present invention is to provide a process for fabricating an Al contact, i.e. bond pad, on Cu BEOL which overcomes all of the problems associated with the prior art method of fabricating the same.

A further object of the present invention is to provide a process for fabricating an Al contact which is in electrical communication with the underlying Cu wiring embedded in an IC structure.

Another object of the present invention is to provide a process for fabricating an Al contact in Cu BEOL structures such that when bonded with a semiconductor package no fracturing of the underlying material layers is observed.

An additional object of the present invention is to provide a process for forming a solder ball connection that would prevent mixing of the solder materials with the copper wiring and would allow utilization of conventionally used solder and ball limiting metallurgy (BLM) materials with the copper interconnect processes.

These and other aspects and advantages can be achieved in the present invention by utilizing a method which comprises the steps of:

(a) forming a passivating layer on an integrated circuit (IC) semiconductor wafer containing Cu wiring therein;

(b) forming terminal via openings through said passivating layer to expose said Cu wiring;

(c) forming a barrier layer at least over said exposed Cu wiring, on the side walls of said terminal via openings and on regions of said barrier layer near said terminal via openings;

(d) forming an Al stack on said barrier layer at least in said terminal via openings and on regions of the barrier layer near said terminal via openings;

(e) patterning and etching said Al stack and said barrier layer;

(f) forming a second passivating layer over said patterned Al stack; and (g) providing second openings in said second passivating layer so as to expose a region of said patterned Al stack located on top of said Cu wiring.

In one embodiment of the present invention, step (g) above is replaced with (g'), which comprises providing second openings in said second passivating layer so as to expose a region of said patterned Al stack not located on top of said Cu wiring.

In another embodiment of the present invention, the method of the present invention comprises first conducting steps (a)–(g) or (a)–(g') mentioned above and then providing a wirebond or C4 solder material to said exposed Al stack, i.e. the Al pads, so as to provide means for interconnecting the IC structure to a semiconductor package.

In another aspect of the present invention, an IC structure containing an Al contact in electrical communication with underlying Cu wiring is provided. Specifically, the IC structure of the present invention comprises a semiconductor wafer having Cu wiring embedded therein, a first passivating layer on top of said semiconductor wafer having terminal via openings therein so as to expose said Cu wiring; a barrier layer on at least said exposed Cu wiring, sidewalls of the terminal via openings and on the passivating layer near the terminal via openings; an Al stack on said barrier layer; and a second passivating layer on said Al stack having an opening therein exposing a region of the Al stack on top of the underlying Cu wiring.

In one embodiment, the IC structure has a second passivating layer on said patterned Al stack having an opening therein exposing a region of the patterned Al stack not on top of the underlying Cu wiring.

DETAILED DESCRIPTION OF THE INVENTION

Figure 1:
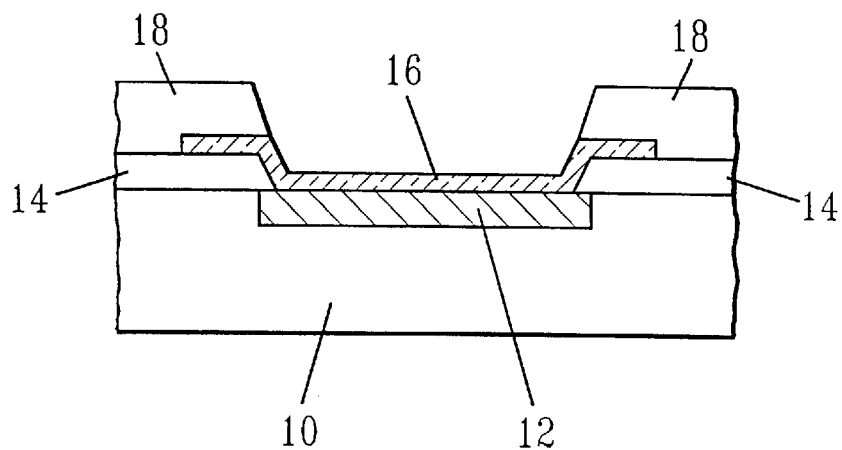
FIG. 1 is a prior art TC BEOL structure containing a wirebond connection directly to an underlying copper interconnect wire.

The present invention will now be described in more detail with reference to the accompanying drawings, wherein like reference numerals are used for like and corresponding elements of the drawings. Reference is made first to FIGS. 2(a)–(d) and FIGS. 3(a)–(d) which show two embodiments that are employed in the present invention to fabricate an IC structure of the present invention wherein an Al contact is in electrical communication with the underlying Cu wiring. In FIGS. 2(a)–(d), the Al contact is located directly on top of the underlying Cu wiring, whereas in FIGS. 3(a)–(d), the Al contact is not located on top of the underlying Cu wiring.

Figure 2A:
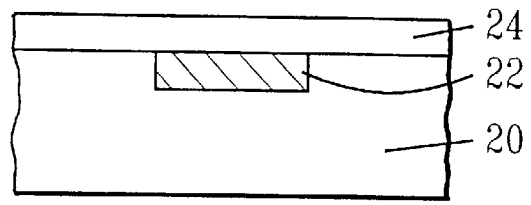
FIGS. 2(a)–(d) show the processing steps employed in the present invention to fabricate an IC structure wherein the contact layer is located over the exposed copper wiring.
Figure 3A:
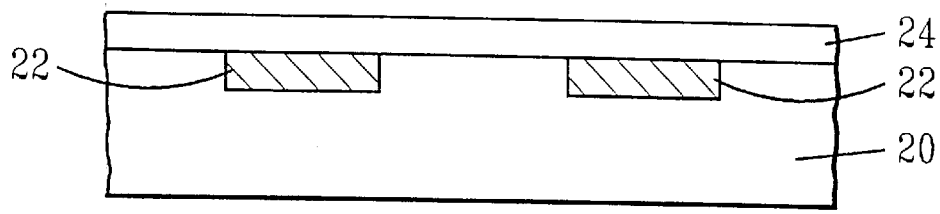
FIGS. 3(a)–(d) show the processing steps employed in the present invention to fabricate an IC structure wherein the contact region of the bond pad is displaced from the region of the pad where the copper connection is formed.

In FIG. 2(a) or 3(a), there is shown a typical IC structure that can be employed in the present invention. Specifically, the IC structure comprises a semiconductor wafer 20 having Cu wiring 22 embedded in its surface and a passivating layer 24 formed thereon. This structure may also contain a plurality of IC device regions in semiconductor wafer 20. For simplicity, such IC device regions are not shown in the drawings.

The IC structure of FIG. 2(a) or FIG. 3(a) is fabricated using methods well known to those skilled in the art for producing such a structure. This includes, but is not limited to: providing via openings in a semiconductor wafer by standard lithographic procedures; filling the via with Cu; subjecting the Cu filled structure to Chemical Mechanical Polishing (CMP) or any other polishing step that is capable of forming a planarized structure; and depositing a passivating layer on the surface of the structure using any known deposition technique such as sputtering, chemical vapor deposition and plasma vapor deposition.

The semiconducting material which makes-up wafer 20 may be composed of any material that is semiconducting in nature. This includes dielectric materials such as $SiO_2$ and diamond-like carbon as well as Si, Ge, GaAs, GaP, InAs, and InP. Of these semiconducting materials, it is highly preferred in the present invention that Si be employed as the semiconductor material of wafer 20.

In accordance with the present invention, passivating layer 24 comprises at least one material that is capable of preventing moisture and/or ions from contacting Cu wiring 22. Suitable materials include, but are not limited to: $SiO_2$, $Si_3N_4$, and combinations thereof. A highly preferred passivating layer that can be employed in the present invention is a combination of the above materials such as $SiO_2/Si_3N_4$ or $Si_3N_4/SiO_2/Si_3N_4$.

Although the thickness of the passivating layer may vary depending upon the type of materials used in forming the same, it typically has a thickness of from about 500 to about 20,000 Å. More preferably, the thickness of the passivating layer is generally of from about 5000 to about 10,000 Å. In the embodiment wherein a combination of oxides and nitrides are employed, the first, optional nitride layer, which functions as an adhesion layer, has a thickness of from about 100 Å or less to about 1000 Å, the oxide layer has a thickness of from about 5000 to about 10,000 Å; and the other nitride layer has a thickness of from about 5000 to about 10,000 Å. More preferably, in the embodiment wherein a nitride, oxide, nitride passivating layer is employed, the thickness of the optional first nitride layer is from about 400 to about 900 Å, the thickness of the oxide layer is from about 5000 to about 10,000 Å, and the thickness of the other nitride layer is from about 5,000 to about 1,000 Å.

Figure 2B:
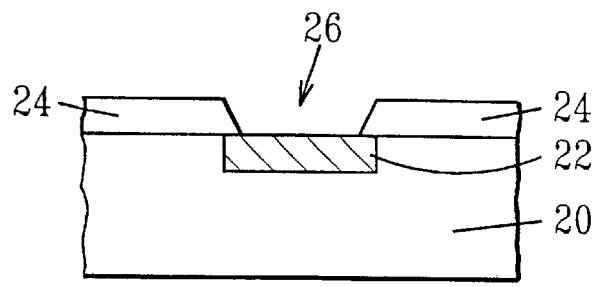
Figure 3B:
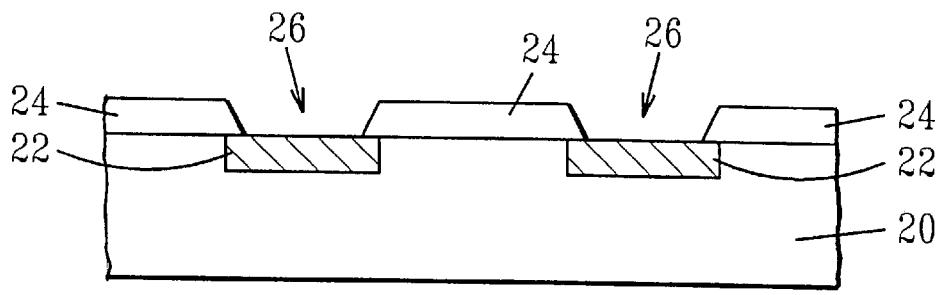

Next, as is shown in FIG. 2(b) or FIG. 3(b), passivating layer 24 is patterned so as to form terminal via openings 26 through the passivating layer to expose embedded Cu wiring 22. The terminal via openings are formed using standard lithographic techniques well known to those skilled in the art including: providing a photoresist to the passivating layer; patterning the photoresist; etching the patterned photoresist utilizing either a dry etch process such as RIE or a wet chemical etch process; and then stripping the photoresist.

This provides the structure of FIG. 2(b) or FIG. 3(b) having terminal via openings 26 exposing Cu wiring 22 in the structure.

After forming terminal via openings 26 in the structure, a barrier layer 28 is formed at least over the exposed Cu wiring regions, on the sidewalls of terminal via openings 26 and on the surface of passivating layer 24 near the terminal via openings. Any barrier layer known to those skilled in the art which ensures throughput of electrical current can be used in the present invention. Examples of suitable barrier layers that can be employed in the present invention include, but are not limited to: TaN, TiN, Ta, Cr, W, and combinations thereof. Of these materials, it is highly preferred that barrier layer 28 be composed of TaN.

The barrier layer is formed utilizing deposition techniques well known to those skilled in the art. Thus, the barrier layer can be formed by sputtering, chemical vapor deposition, plasma vapor deposition, electroplating, electroless plating and other like deposition techniques. The thickness of the barrier layer formed in the present invention may vary, but the thickness of the barrier layer is typically of from about 100 to about 1500 Å. More preferably, barrier layer 28 has a thickness of from about 300 to about 800 Å.

In accordance with the next step of the present invention, an Al stack 30 is formed on the surface of barrier layer 28 at least in terminal via openings 26 and regions of the barrier layer near the terminal via openings. The term "Al stack" is used herein to denote a plurality of metallic layers in which the outermost layer contains Al or an alloy of Al. In the drawings, the Al stack is shown as one layer. One highly preferred Al stack configuration that can be employed in the present invention comprises Ti/TiN/AlCu. Other Al stacks such as Ti/AlCu/TiN, Ti/Al/TiN, Ti/Al/TiN, Ti/TiN/AlCuSi/TiN or Ti/AlCuSi may also be employed in the present invention. Alloys of Al—Cu—Si, Al—Cu or Al are also contemplated herein as possible Al stacks.

The Al stack is formed utilizing any of the above described deposition techniques useful in forming barrier layer 28. Typically, sputtering is the preferred means for depositing Al stack 30. The thickness of Al stack 30 may also vary, but generally it has a thickness of from about 1000 to about 20,000 Å. More preferably, Al stack has a thickness of from about 5000 to about 10,000 Å.

The Al stack and the barrier layer are then patterned and etched utilizing standard techniques known in the art. For example, the Al stack and barrier layer can be patterned by conventional lithography and then etched by reactive ion etching.

Second passivating layer 32 can be formed utilizing any of the known deposition techniques mentioned hereinabove in forming passivating layer 24. Inorganic as well as organic passivating materials can be employed as passivating layer 32. When inorganic materials are employed as second passivating layer 32, an oxide/nitride combination is employed. The thickness of the inorganic passivating layer, e.g. layer 32, is from about 2000 to about 10,000 Å each, with a preferred thickness of from about 4000 to about 6000 Å each. The inorganic passivating layer can be employed alone or with an organic passivating material.

When an organic passivating layer is employed as layer 32, a polyimide or polysiloxane having a thickness of from about 1 to about 5 microns can be employed. More preferably, the organic passivating layer has a thickness of from about 2 to about 4 microns.

Figure 2C:
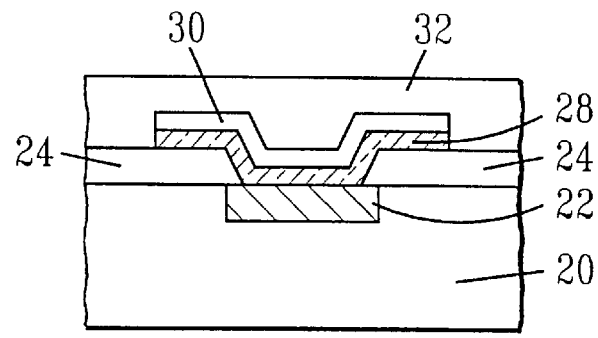
Figure 2D:
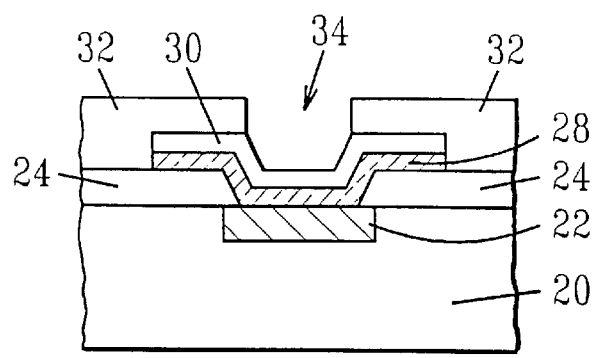
Figure 3C:
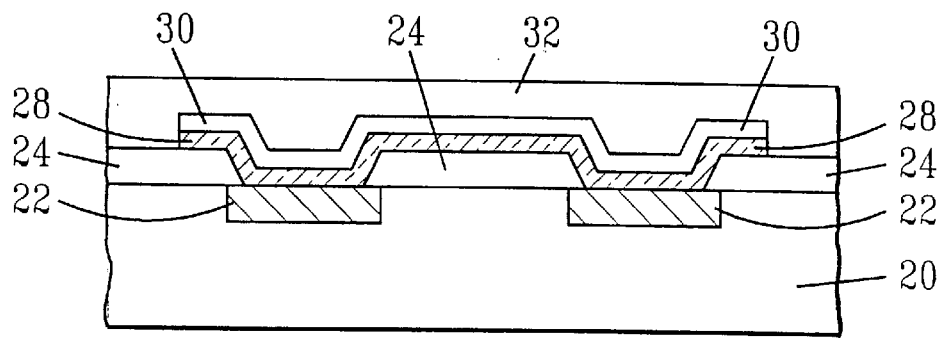
Figure 3D:
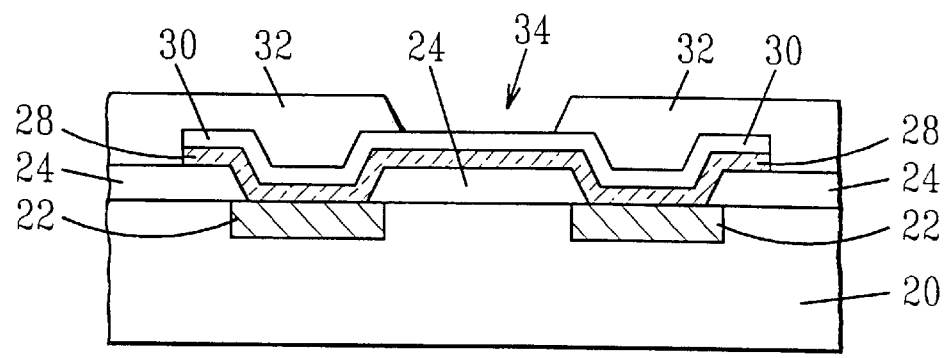

The structure containing patterned barrier layer 28, patterned Al stack 30 and second passivating layer 32 is shown in FIG. 2(c) or FIG. 3(c). FIG. 2(d) or FIG. 13(d) show the final structure that is fabricated prior to forming an electrical interconnection with a semiconductor package. Specifically, FIG. 2(d) illustrates the step of the present invention wherein second opening 34 is formed in the surface of second passivating layer 32 so as to expose regions of patterned Al stack 30 over underlying Cu wiring 22. In FIG. 3(d), second opening 34 is formed in the surface of second passivating layer 32 so as to expose regions of patterned Al stack 30 not over underlying Cu wiring 22.

The second opening which can also be referred to as a final via opening is formed in the present invention by utilizing standard lithographic techniques of the kind mentioned above in forming terminal via opening 26. The structures provided in FIG. 2(d) or FIG. 3(d), which are representative of the present invention, contain exposed regions of patterned Al stack 30 that are referred to herein as an Al contact or Al bond pad. This Al contact is in electrical communication with the underlying Cu wiring. Thus, it overcomes the drawbacks mentioned with prior art structures.

Figure 5A:
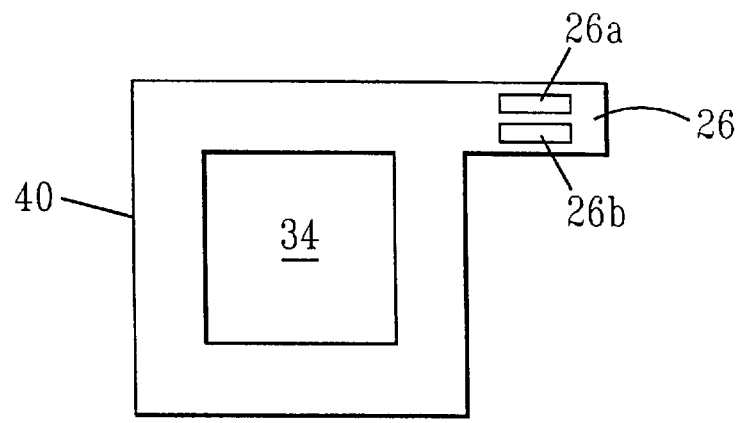
FIGS. 5(a)–(b) are top views of the two types of structures produced in the present invention.
Figure 5B:
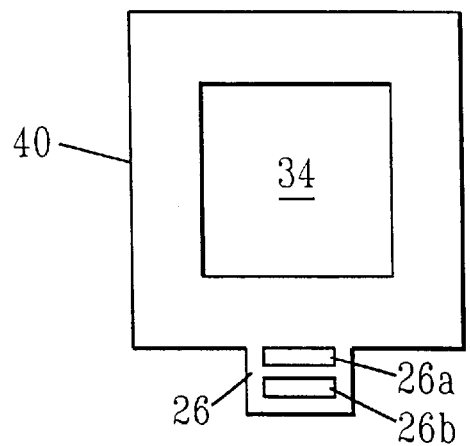

A top view of the structure shown in FIG. 2(d) is shown in FIG. 5(a) whereas a top view of the structure shown in FIG. 3(d) is shown in FIG. 5(b). Specifically, FIGS. 5(a)–(b) comprises Al contact or pad 40, second opening 34 in the second passivating layer, terminal via opening 26 and terminal via images 26a and 26b. In FIG. 5(b), the Al contact is located at a short distance from the terminal via opening and connected with a short section of the Al contact.

Figure 4A:
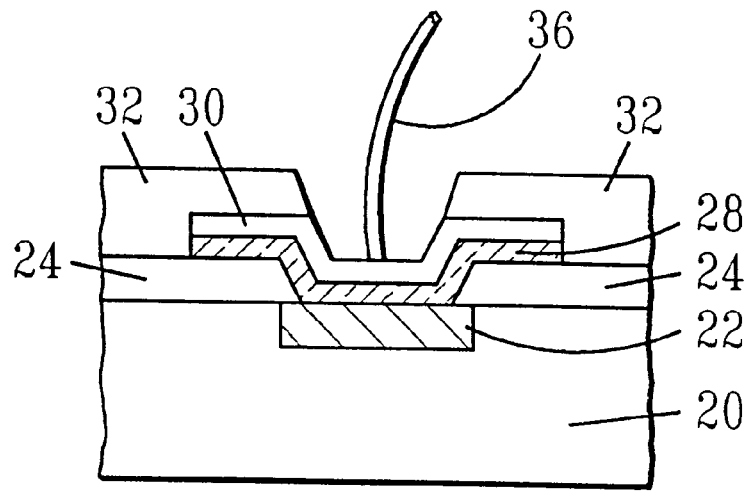
FIGS. 4(a)–(d) show the interconnect structures of FIG. 2(d) and FIG. 3(d) after wire bonding and C4 (solder-ball) interconnecting.
Figure 4B:
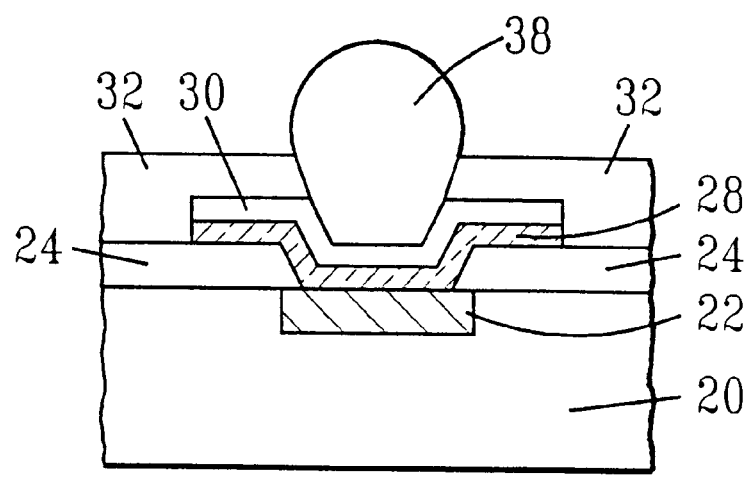
Figure 4C:
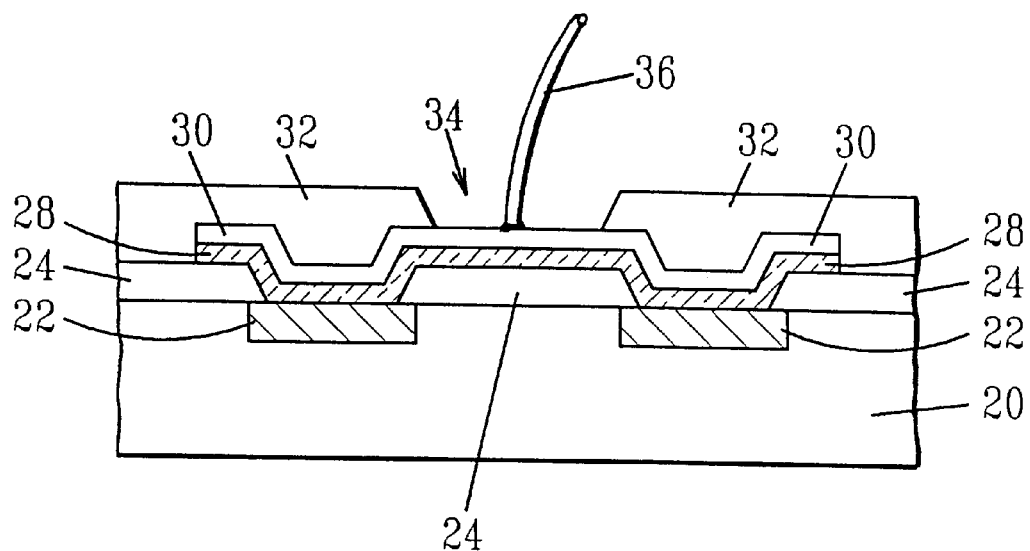
Figure 4D:
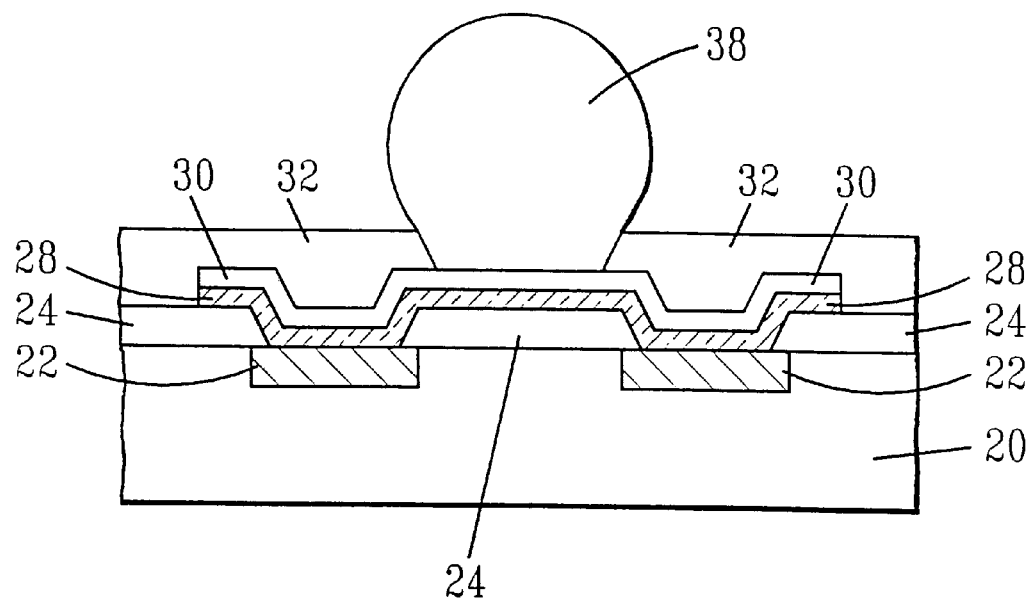

A further aspect of the present invention is shown in FIGS. 4(a)–(d). Specifically, FIGS. 4(a)–(d) shown interconnect IC structures which contain either a wirebond 36 (as shown in FIGS. 4(a) and 4(c)) or a C4 solder material 38 (as shown in FIGS. 4(b) and 4(d)).

When a wirebond is utilized, the wire may be composed of any conductive material such as but not limited to: gold or alloys of gold and the bond is formed utilized bonding techniques well known to those skilled in the art. When a C4 solder material is employed, the solder comprises Pb-containing alloy such as Pb—Sn. The C4 interconnection is formed utilizing C4 processing technologies that are also well known to those skilled in the art.

In FIGS. 4(a)–4(d), the interconnect structure shown, containing the Al contact, is bonded to a semiconductor package which is not shown in the drawings of the present invention.

It is emphasized that the method of the present invention significantly reduces the Cu wiring from exposure or attack by etching chemistries as well as eliminating the problem of Cu—Al. intermixing. Moreover, the region under the Al contact could be utilized for providing a wire channel in the Cu wiring level.

While the invention has been particularly shown and described with respect to preferred embodiments thereof, it will be understood by those skilled in the art that the foregoing and other changes in form and detail made be made without departing from the scope and spirit of the present invention. It is therefore intended that the present invention not be limited to the exact forms described and illustrated, but fall within the scope of the appended claims.

Having thus described our invention, what we claim as new, and desire to secure Letters Patent is:

1. An IC structure containing an Al contact in electrical communication with underlying Cu wiring comprising an IC semiconductor wafer having Cu wiring embedded therein, a first passivating layer on top of said semiconductor wafer having terminal via openings therein so as to expose said Cu wiring; a barrier layer on at least said exposed Cu wiring, sidewalls of the terminal via openings and on the passivating layer near the terminal via openings; an Al stack on said barrier layer; and a second passivating layer on said Al stack having openings therein exposing the Al stack covering said Cu wiring.

2. The IC structure of claim 1 wherein said passivating layer has openings exposing the Al stack not covering said Cu wiring.

3. The IC structure of claim 1 wherein said IC semiconductor wafer includes IC device regions.

4. The IC structure of claim 3 wherein said IC semiconductor wafer comprises $SiO_2$, diamond-like carbon, Si, Ge, GaAs, GaP, InAs or InP.

5. The IC structure of claim 4 wherein said IC semiconductor wafer comprises Si.

6. The IC structure of claim 1 wherein said passivating layer comprises $SiO_2$, $Si_3N_4$ or combinations thereof.

7. The IC structure of claim 6 wherein said passivating layer comprises $SiO_2/Si_3N_4$ or $Si_3N_4/SiO_2/Si_3N_4$.

8. The IC structure of claim 1 wherein said barrier layer comprises TaN, TiN, Cr, Ta, W, Ti or combinations thereof.

9. The IC structure of claim 8 wherein said barrier layer comprises TaN.

10. The IC structure of claim 1 wherein said Al stack comprises a plurality of metallic layers in which the outermost layer contains Al or an alloy of Al.

11. The IC structure of claim 10 wherein said Al stack is Ti/TiN/AlCu, Ti/AlCu/TiN, Ti/Al/TiN, Ti/Al/TiN, Ti/TiN/AlCuSi/TiN or Ti/AlCuSi.

12. The IC structure of claim 1 wherein said second passivating layer is an organic polymer selected from the group consisting of polyimides and polysiloxanes.

13. The IC structure of claim 12 wherein said second passivating layer is a polyimide.

14. The IC structure of claim 1 wherein said second passivating layer is an inorganic material selected from the group consisting of $SiO_2$, $Si_3N_4$, $SiO_2/Si_3N_4$, and $Si_3N_4/SiO_2/Si_3N_4$.

15. The IC structure of claim 1 wherein said second passivating layer is a combination of an organic polymer and an inorganic material.

* * * * *